US008934644B2

(12) United States Patent
Takemura

(10) Patent No.: US 8,934,644 B2
(45) Date of Patent: Jan. 13, 2015

(54) CHANNEL DIVIDER, SOUND REPRODUCING SYSTEM INCLUDING THE CHANNEL DIVIDER, AND METHOD FOR SETTING CROSSOVER FREQUENCY OF THE CHANNEL DIVIDER

(71) Applicant: Onkyo Corporation, Osaka (JP)

(72) Inventor: Kazumasa Takemura, Osaka (JP)

(73) Assignee: Onkyo Corporation, Neyagawa-shi (JP)

(*) Notice: Subject to any disclaimer, the term of this patent is extended or adjusted under 35 U.S.C. 154(b) by 136 days.

(21) Appl. No.: 13/675,185

(22) Filed: Nov. 13, 2012

(65) Prior Publication Data

US 2013/0163770 A1 Jun. 27, 2013

(30) Foreign Application Priority Data

Dec. 22, 2011 (JP) ................................ 2011-282373

(51) Int. Cl.
*H03G 5/00* (2006.01)
*H04R 3/14* (2006.01)

(52) U.S. Cl.
CPC ........................................ *H04R 3/14* (2013.01)
USPC ................................ 381/99; 381/103; 381/98

(58) Field of Classification Search
USPC ............................ 381/57, 58, 95, 96, 98–103
See application file for complete search history.

(56) References Cited

U.S. PATENT DOCUMENTS

| | | | | |
|---|---|---|---|---|
| 4,845,758 | A * | 7/1989 | Op de Beek et al. | 381/98 |
| 2002/0161543 | A1* | 10/2002 | Yoshino et al. | 702/111 |
| 2007/0121964 | A1* | 5/2007 | Rumreich | 381/99 |

FOREIGN PATENT DOCUMENTS

| | | | |
|---|---|---|---|
| JP | 5-39097 | | 5/1993 |
| JP | 2002-111399 | | 4/2002 |
| JP | 2005-184149 | * | 1/2005 |
| JP | 2005-253001 | * | 1/2005 |
| JP | 2005-109969 | | 4/2005 |
| JP | 2005-184149 | | 7/2005 |
| JP | 4321315 | | 6/2009 |

OTHER PUBLICATIONS

Rane, Bandwidth in OCtaves Versus Q in Bandpass Filters, 2008.*

* cited by examiner

*Primary Examiner* — Vivian Chin
*Assistant Examiner* — William A Jerez Lora
(74) *Attorney, Agent, or Firm* — Renner, Otto, Boiselle & Sklar, LLP

(57) ABSTRACT

A channel divider that can suitably set a crossover frequency when a biwiring-connectable multiway speaker system including network circuits are used is provided. The channel divider includes a low-pass filter LPF and a high-pass filter HPF for dividing a band of a sound signal into a first output signal and a second output signal so as to output the signals, and a control circuit for controlling the filters. The channel divider has a sound output mode in which the control circuit sets a cutoff frequency fcL of LPF to a value higher than fc0 by about ⅙ to 1 Oct., sets a cutoff frequency fcH of HPF to a value lower than fc0 by about ⅙ to 1 Oct., and outputs the first output signal and the second output signal including frequency bands fcL to fcH when any crossover frequency fc0 for defining the band division is specified.

9 Claims, 9 Drawing Sheets

CHANNEL DIVIDER, SOUND REPRODUCING SYSTEM INCLUDING THE CHANNEL DIVIDER, AND METHOD FOR SETTING CROSSOVER FREQUENCY OF THE CHANNEL DIVIDER

BACKGROUND OF THE INVENTION

1. Field of the Invention

The present invention relates to a channel divider to be used for reproducing a sound signal through a multiway speaker system and a method for setting its crossover frequency. The invention particularly relates to the channel divider that can suitably set the crossover frequency of the channel divider and can satisfactorily reproduce a sound when a biwiring-connectable speaker system including network circuits are used.

2. Description of the Related Art

In multiway speaker systems including woofers for low-pitched reproduction and tweeters for high-pitched reproduction, network circuits for dividing a band of a sound signal amplified by an amplifier according to a reproduction frequency band of each speaker unit are generally provided. In recent years, the following speaker systems where a network circuit corresponding to a woofer and a network circuit corresponding to a tweeter can be independent from each other are widely used (hereinafter, abbreviated as a biwiring SS). Such systems have input terminals connected to these network circuits, respectively, and are compatible with biwiring connection. The biwiring connection adopts biamplifying drive using a power amplifier to be connected to the network circuit of the woofer and another power amplifier to be connected to the network circuit of the tweeter.

On the other hand, in a method for realizing the multi amplifying (bi-amplifying) drive without using the network circuits of the speaker system, a channel divider is provided in a previous stage of the power amplifier, and the channel divider occasionally divides a band of a sound signal. The channel divider divides a band of an input sound signal into at least a low-pitched output signal and a high-pitched output signal so as to output the signals to a multi-amplifier in a sound reproducing system of the above multi-amplifier and multiway speaker system. The use of the channel divider provides advantages such that an LPF (low-pass filter) having an excess band steeper than that of the network of a speaker system or an HPF (high-pass filter) can be set, and a crossover frequency can be set comparatively freely (for example, Japanese Patent Application Laid-Open No. 2005-109969). When the channel divider is adopted, since a low-pitched amplifying circuit and a high-pitched amplifying circuit are independent from each other, cross-modulation distortion generated due to superimposing of a low frequency component and a high frequency component is reduced, and thus reproduction sound quality is excellent.

In recent years, some DSPs are provided with a function of the channel divider so that a speaker system without a network circuit can be connected by using an AV receiver including the DSP and a multi-amplifier (Japanese Patent Application Laid-Open Nos. 2002-111399 and 2005-184149). When the channel divider is realized by a digital filter, an FIR filter or an IIR filter is occasionally used. In order to use the channel divider, a reproduction band of each speaker unit in the speaker system should be measured by using a microphone, and a crossover frequency should be suitably set (Japanese Patent No. 4321315, and Japanese Utility Model Application Laid-Open No. 5-39097 (1993)).

In conventional channel divider, when a crossover frequency is set between a woofer and a tweeter, this is automatically applied to a cutoff frequency between a low-pitched LPF and a high-pitched HPF. Certainly, a channel divider where a cutoff frequency of a low-pitched LPF and a cutoff frequency of a high-pitched HPF can be set independently is surely present. Since reproducible range of a woofer and a reproducible range of a tweeter are mostly overlapped with each other under use condition without using a network circuit, cutoff frequencies of filters in charge of adjacent frequency bands are mostly set to uniform values in the overlapped bands.

However, even when the channel divider is tried to be used in the sound reproducing system, it is very difficult for general users except for some users to structure a speaker system without a network circuit (a marketed production is converted, the speaker system is built by using only units or the like) and to set a suitable crossover frequency using a microphone. Even when a biamp drive is enabled by using a multichannel amplifying circuit, a domestic audio device such as an AV receiver rarely adopts the function of the channel divider.

On the other hand, when the biamp drive is tried to be realized by using biwiring SS including a common network circuit and a channel divider, it is actually difficult to set a crossover frequency. Since the biwiring SS including a network circuit is designed so as to obtain a predetermined flat synthesized characteristic, when the channel divider sets a crossover frequency at a previous stage of the multichannel amplifying circuit to divide a band, as a result, dip is occasionally generated in a sound pressure frequency characteristic. When crossover frequency set by the channel divider is shifted from the crossover frequency of the biwiring SS, the dip on the sound pressure frequency characteristic increases, and thus a band where suitable reproduction is not carried out is widened. Further, when a measuring device such as the microphone, a level meter or an FFT analyzer is not provided, it is difficult for general users to understand an unknown crossover frequency of the biwiring SS, and thus it is occasionally difficult for general users to set the crossover frequency through the channel divider.

SUMMARY OF THE INVENTION

The present invention is devised in order to solve the above problem of the conventional technique, and its object is to provide a channel divider to be used for reproducing a sound signal in a multiway speaker system and a method for setting a crossover frequency of the channel divider, and particularly provide the channel divider that can suitably set the crossover frequency of the channel divider when a biwiring-connectable speaker system that includes a network circuit is used.

A channel divider according to the present invention comprises: a low-pass filter LPF and a high-pass filter HPF for dividing a band of an input sound signal into at least a first output signal whose frequency is lower and a second output signal whose frequency is higher than that of the first output signal and outputting them to a first output terminal and a second output terminal; a control circuit for controlling the filters; and a sound output mode in which when any crossover frequency fc0 for defining the band division is specified, the control circuit sets a cutoff frequency fcL of the low-pass filter LPF to a value higher than the crossover frequency fc0 by about ⅙ to 1 Oct., and sets a cutoff frequency fcH of the high-pass filter HPF to a value lower than the crossover frequency fc0 by about ⅙ to 1 Oct., so as to output the first output signal and the second output signal including frequency bands fcL to fcH to the first output terminal and the second output terminal, respectively.

Preferably, the channel divider according to the present invention further comprises: a test signal generating circuit for generating a test signal including a predetermined band; and a test signal output mode in which the control circuit allows the test signal to pass through a narrow band pass filter BPF constituted by connecting the low-pass filter LPF and the high-pass filter HPF in series, and switches to output the output signal from the narrow band pass filter BPF only from the first output terminal or only from the second output terminal or from both the first output terminal and the second output terminal.

Preferably, each of the low-pass filter LPF and the high-pass filter HPF includes; a level control circuit for adjusting a level of the first output signal or the second output signal, a phase inverter for inverting a phase of the first output signal or the second output signal, and a delay circuit for adjusting a delay time of the first output signal or the second output signal.

Preferably, the channel divider according to the present invention, further comprises: a microphone for converting a sound into a sound signal so as to input it as a measured signal to the control circuit; and a display circuit for displaying a level of the measured signal from the microphone, wherein in the test signal output mode, the control circuit compares a first measurement level that is measured when the test signal as the output from the narrow band pass filter BPF is output only from the first output terminal with a second measurement level that is measured when the test signal is output only from the second output terminal, and the display circuit displays a suggestion that the crossover frequency fc0 is changed or maintained, or the control circuit changes or maintains the crossover frequency fc0 to set it.

Preferably, in the test signal output mode, the control circuit compares a third measurement level that is measured when the test signal as the output from the narrow band pass filter BPF is output from both the first output terminal and the second output terminal with the first measurement level and the second measurement level, and when the third measurement level is lower than the first measurement level or the second measurement level by a predetermined value or more, the display circuit displays a suggestion of a change into reverse-phase connection, or the control circuit inverts a phase of the first output signal or the second output signal.

Preferably, the channel divider according to the present invention further comprises a band-specific sound output mode for outputting only the first output signal from the first output terminal or only the second output signal from the second output terminal in the sound output mode.

Preferably, the channel divider according to the present invention divides the band of the input sound signal into a third output signal whose frequency is lower than that of the first output signal and/or a fourth output signal whose frequency is higher than that of the second output signal, and outputs the third and/or fourth output signals to a third output terminal and/or a fourth output terminal, respectively, wherein the band pass filter BPF is constituted by combining another high-pass filter HPF or another low-pass filter LPF where the low-pass filter LPF and the high-pass filter HPF are connected in series, and output is carried out to the first output terminal or the second output terminal.

A sound reproducing system according to the present invention comprises: the channel divider; an amplifier including amplifying circuits corresponding to the output terminals of the channel divider; and a speaker system including at least network circuits corresponding to a woofer and a tweeter, respectively, the speaker system biwiring-connectable to the amplifier.

A method for detecting a crossover frequency fc between a woofer and a tweeter set by a network circuit of a speaker system so as to set a crossover frequency fc0 of a channel divider in an audio reproducing system includes the channel divider, an amplifier and a speaker system. The channel divider includes a low-pass filter LPF and a high-pass filter HPF for dividing a band of an input sound signal into at least a first output signal whose frequency is lower and a second output signal whose frequency is higher than that of the first output signal so as to output them to a first output terminal and a second output terminal respectively. The amplifier includes amplifying circuits corresponding to the output terminals of the channel divider respectively. The speaker system includes at least a woofer, a tweeter and network circuits corresponding to the woofer and the tweeter respectively, and the speaker system is biwiring-connectable to the amplifier. The method comprises: a step of specifying any crossover frequency fc0 for defining the band division of the channel divider; a step of setting a cutoff frequency fcL of the low-pass filter LPF to a value higher than the crossover frequency fc0 by about ⅙ to 1 Oct.; a step of setting a cutoff frequency fcH of the high-pass filter HPF to a value lower than the crossover frequency fc0 by about ⅙ to 1 Oct.; a step of connecting the low-pass filter LPF and the high-pass filter HPF in series so as to compose a narrow band pass filter BPF; a step of generating a test signal including a predetermined band so as to allow the test signal to pass through the narrow band pass filter BPF; and a step of switching to output the test signal output of the narrow band pass filter BPF only from the first output terminal or only from the second output terminal or from both the first output terminal and the second output terminal.

A function of the present invention will be described below.

A channel divider of the present invention includes a low-pass filter LPF and a high-pass filter HPF for dividing a band of an input sound signal into at least a first output signal whose frequency is lower and a second output signal whose frequency is higher than that of the first output signal and outputting them to a first output terminal and a second output terminal, and a control circuit for controlling the filters. The channel divider composes a sound reproducing system that includes an amplifier including amplifying circuits corresponding to the output terminals of the channel divider, and a speaker system including at least network circuits corresponding to a woofer and a tweeter, respectively, the speaker system biwiring-connectable to the amplifier. Therefore, since a user adjusts the channel divider so as to be capable of changing a frequency band where the woofer and the tweeter carry out reproduction in an overlapped manner and a reproduction level, adjustment of reproduction sound quality becomes easy. The network circuit of the biwiring SS generally has a transition range characteristic of ±6 to 18 dB/Oct., but the filters LPF and HPF of the channel divider can obtain a transition range characteristic of ±24 to 96 dB/Oct. or more, and thus introduction of the channel divider can increase attenuation rates of a transition range and an inhibition range.

The channel divider of the present invention has a sound output mode in which when any crossover frequency fc0 for defining the band division is specified, the control circuit sets a cutoff frequency fcL of the low-pass filter LPF to a value higher than the crossover frequency fc0 by about ⅙ to 1 Oct., and sets a cutoff frequency fcH of the high-pass filter HPF to a value lower than the crossover frequency fc0 by about ⅙ to 1 Oct., so as to output the first output signal and the second output signal including frequency bands fcL to fcH to the first output terminal and the second output terminal, respectively. That is to say, in the sound output mode of the channel divider, when the biwiring SS including the network circuit is used and the user specifies the crossover frequency fc0 close to the crossover frequency fc between the woofer and the tweeter set by the network circuit, a signal of a frequency band not more than the cutoff frequency fcL higher than the crossover frequency fc0 by about ⅙ to 1 Oct. is output from the low-pass filter LPF, and a signal of a frequency band not less than the cutoff frequency fcH lower than the crossover frequency fc0 by about ⅙ to 1 Oct. is output from the high-pass filter HPF. Therefore, sound signals in a range of 2/6 to 2 Oct. including the crossover frequency fc0 as the center frequency overlap with each other, and are output as the first output signal and the second output signal from the low-pass filter LPF and the high-pass filter HPF, respectively.

As a result, even when the channel divider of the present invention is operated by using the biwiring SS including the network circuit, dip can be prevented from being generated on the sound pressure frequency characteristic. That is to say, this is because even when the crossover frequency set by the channel divider slightly shifts from the crossover frequency of the biwiring SS, each of the first output signal as the output from the low-pass filter LPF and the second output signal as the output from the high-pass filter HPF includes a sound signal in the range of 2/6 to 2 Oct. including the crossover frequency as the center frequency. Since the biwiring SS including the network circuit is adjusted so as to provide a predetermined flat synthesized characteristic, even when the channel divider of the present invention is operated, dip might not be generated on the sound pressure frequency characteristic. On the other hand, when the channel divider sets the transition range characteristic steeper than that of the network circuit of the biwiring SS, the attenuation rates of the transition range and the inhibition range become large. For this reason, the user introduces the channel divider to the case where the biwiring SS including the network circuit is used so as to be capable of adjusting reproduction sound quality.

In the channel divider, the low-pass filter LPF and the high-pass filter HPF may include a level control circuit for adjusting a level of the first output signal or the second output signal, a phase inverter for inverting a phase of the first output signal or the second output signal, and a delay circuit for adjusting a delay time of the first output signal or the second output signal. As a result a range where the reproduction sound quality is adjusted is widened, and thus the channel divider can cope with the biwiring SS that is widely used. Further, the channel divider may further has a band-specific sound output mode for outputting only the first output signal from the first output terminal or only the second output signal from the second output terminal in the sound output mode. The user can adjust the reproduction sound quality while checking a difference between a sound reproduced from the woofer and a sound reproduced from the tweeter in the band-specific sound output mode.

The channel divider of the present invention preferably further has a test signal generating circuit for generating a test signal including a predetermined band, and a test signal output mode for allowing the test signal to pass through a narrow band pass filter BPF constituted by connecting the low-pass filter LPF and the high-pass filter HPF in series, and switching to output the output signal from the narrow band pass filter BPF only from the first output terminal or only from the second output terminal or from both the first output terminal and the second output terminal. That is to say, even if the crossover frequency set in the network circuit of the biwiring SS is unknown, when a test signal including a predetermined band is generated and is allowed to pass through the narrow band pass filter BPF, and switching is made so that the test signal output from the narrow band pass filter BPF is output only from the first output terminal or only from the second output terminal or both the first output terminal and the second output terminal, the user can know the unknown crossover frequency by comparing the sound pressure level reproduced from the woofer with the sound pressure level reproduced from the tweeter.

This is because the crossover frequency set by the channel divider means the center frequency of the narrow band pass filter BPF, and only when the center frequency of the narrow band pass filter BPF approximately matches with the crossover frequency of the network circuit, the sound pressure level reproduced from the woofer approximately matches with the sound pressure level reproduced from the tweeter. Therefore, when a step of changing the crossover frequency set by the channel divider is repeated, the unknown crossover frequency of the biwiring SS can be understood.

When the channel divider has a microphone for measuring a reproduction sound of the test signal as the output from the narrow band pass filter BPF, a level of a measured signal from the microphone may be displayed on the display circuit. The control circuit compares a first measurement level that is measured when the test signal is output only from the first output terminal with a second measurement level that is measured when the test signal is output only from the second output terminal, and the display circuit displays a suggestion that the crossover frequency fc0 is changed or maintained. In another manner, the control circuit of the channel divider changes or maintains the crossover frequency fc0 to set it.

When a sound pressure level synthesized at a time of simultaneous reproduction from the woofer and the tweeter reduces to be lower than the sound pressure level of the respective cases, the respective reproduced sound waves are discriminated to be in the reverse-phase relationship where they cancel each other. That is to say, in the test signal output mode, the control circuit compares a third measurement level that is measured when the test signal is output from both the first output terminal and the second output terminal with the first measurement level and the second measurement level, and when the third measurement level is lower than the first measurement level or the second measurement level by a predetermined value or more, the display circuit may display a suggestion of a change into reverse-phase connection. In another manner, the control circuit may invert a phase of the first output signal or the second output signal.

Further, the channel divider of the present invention is not limited to the application to the two-way biwiring SS including the woofer and the tweeter. In order to cope with the biwiring SS as a 3 to 5-way multiway speaker including a sub-woofer and/or mid-range and/or a super-tweeter, the channel divider may divide the input sound signal into a third output signal whose frequency is lower than that of the first output signal and/or a fourth output signal whose frequency is higher than that of the second output signal, and may further output the third and/or fourth output signals to a third output terminal and/or a fourth output terminal. When the band pass filter BPF is constituted by connecting another high-pass filter HPF or another low-pass filter LPF to the low-pass filter LPF or the high-pass filter HPF corresponding to a woofer and a tweeter in the two-way biwiring SS in series, even if the channel divider is operated, the dip on the sound pressure frequency characteristic can be prevented similarly to a case where the biwiring SS including the network circuit is a 3 to 5-way multiway speaker.

Particularly when the channel divider of present invention includes the network circuit and is used in the biwiring-connectable speaker system, the channel divider can suitably set the crossover frequency of the channel divider, and can reproduce a sound satisfactorily without dip on the sound pressure frequency characteristic.

DETAILED DESCRIPTION OF THE PREFERRED EMBODIMENTS

A channel divider, a sound reproducing system including the channel divider, and a method for setting a crossover frequency of the channel divider according to a preferred embodiment of the present invention will be described below, but the present invention is not limited to these embodiments.

Figure 1:
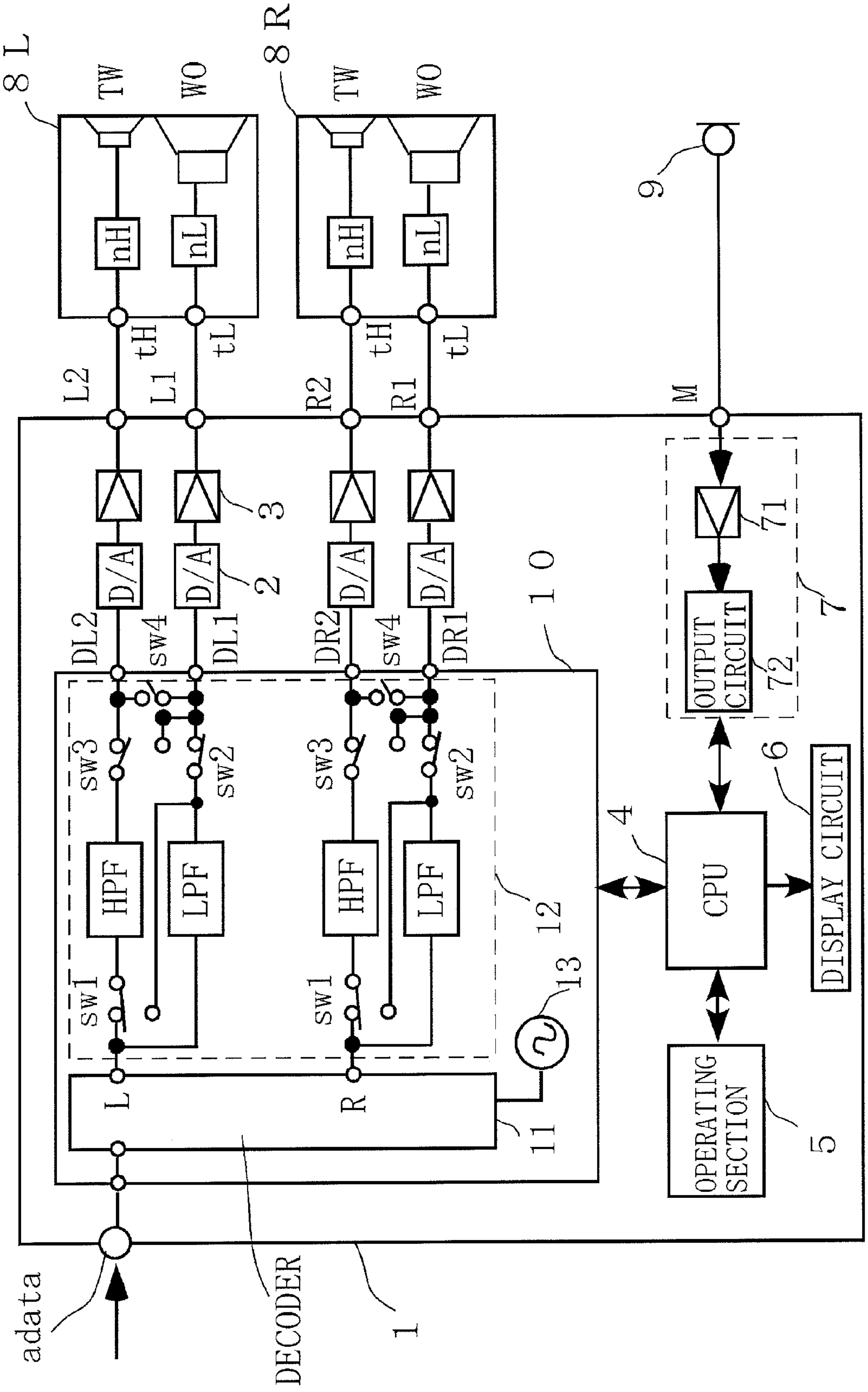
FIG. 1 is a diagram describing a sound reproducing system including an amplifier device 1 according to a preferred embodiment of the present invention; (first embodiment)
Figure 2:
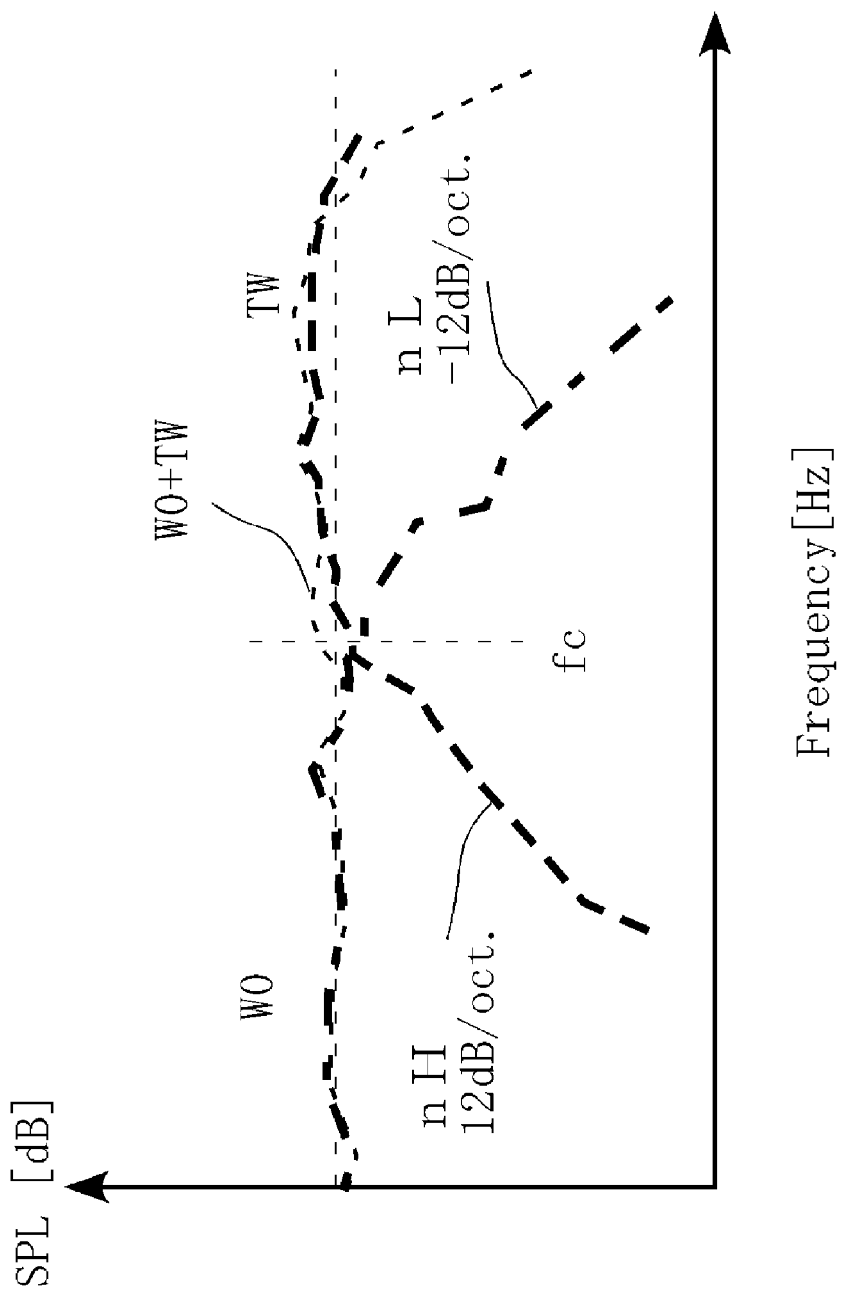
FIG. 2 is a graph describing a sound pressure frequency characteristic of a speaker system 8 composing the sound reproducing system according to the preferred embodiment of the present invention; (first embodiment)
Figure 3:
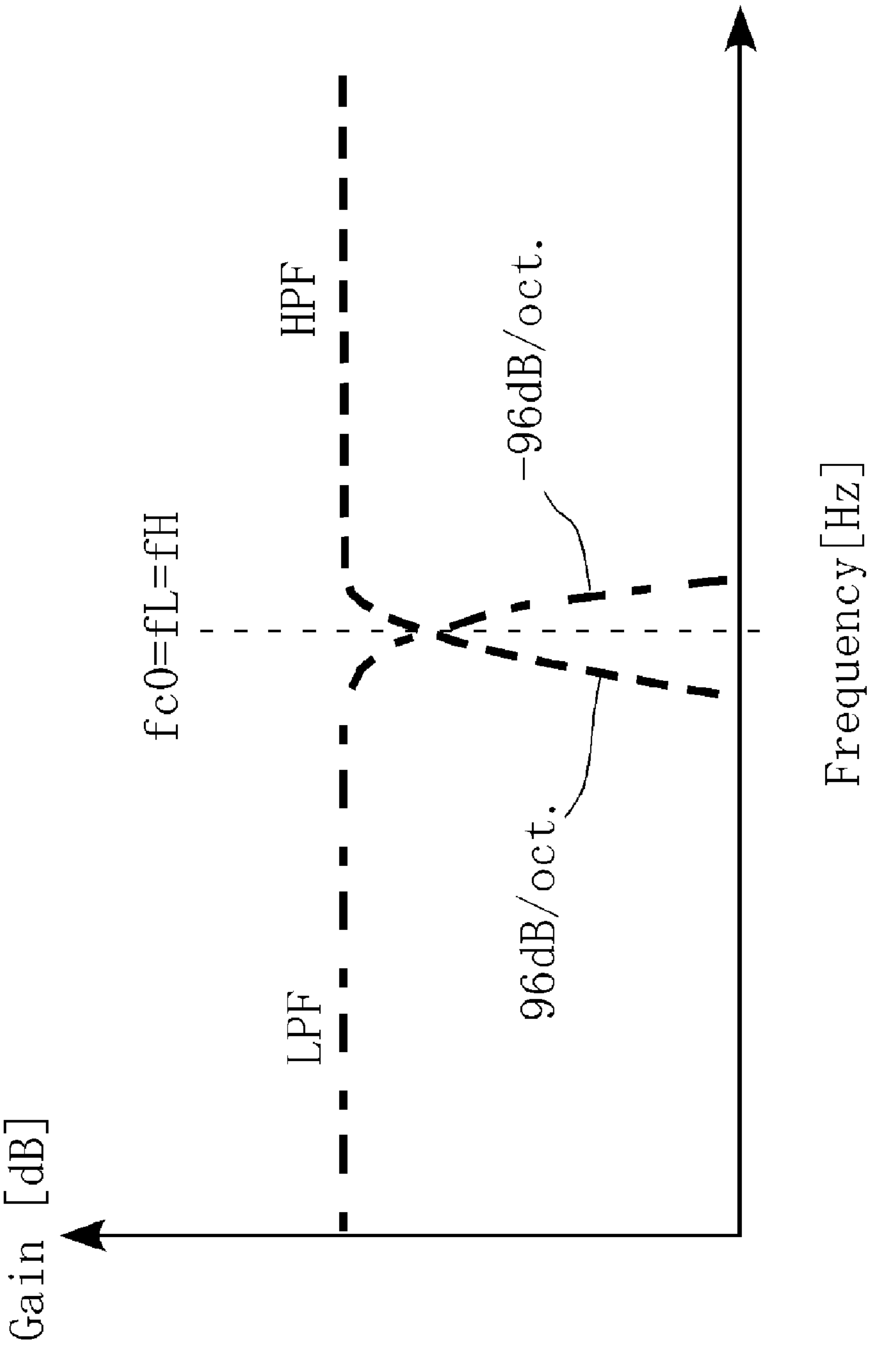
FIG. 3 is a graph describing a crossover characteristic of the channel divider 12 in the amplifier device 1 (the case where a cutoff frequency fcL of a low-pass filter LPF and a cutoff frequency fcH of a high-pass filter HPF are set to an equal value); (first embodiment)
Figure 4:
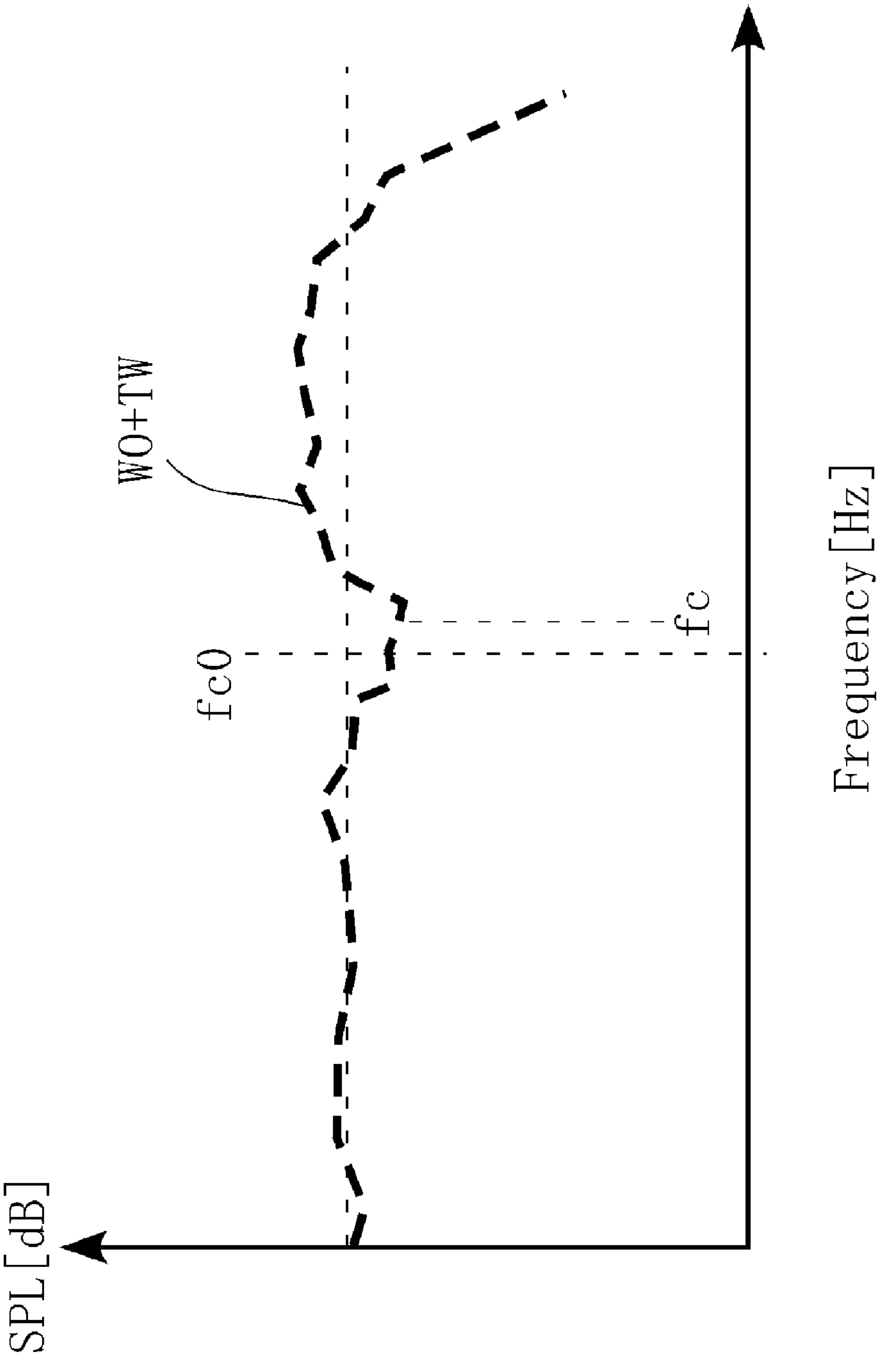
FIG. 4 is a graph describing the sound pressure frequency characteristic of the speaker system 8 when the channel divider 12 of the amplifier device 1 is used (the case where the cutoff frequency fcL of the low-pass filter LPF and the cutoff frequency fcH of the high-pass filter HPF are set to an equal value); (first embodiment)
Figure 5:
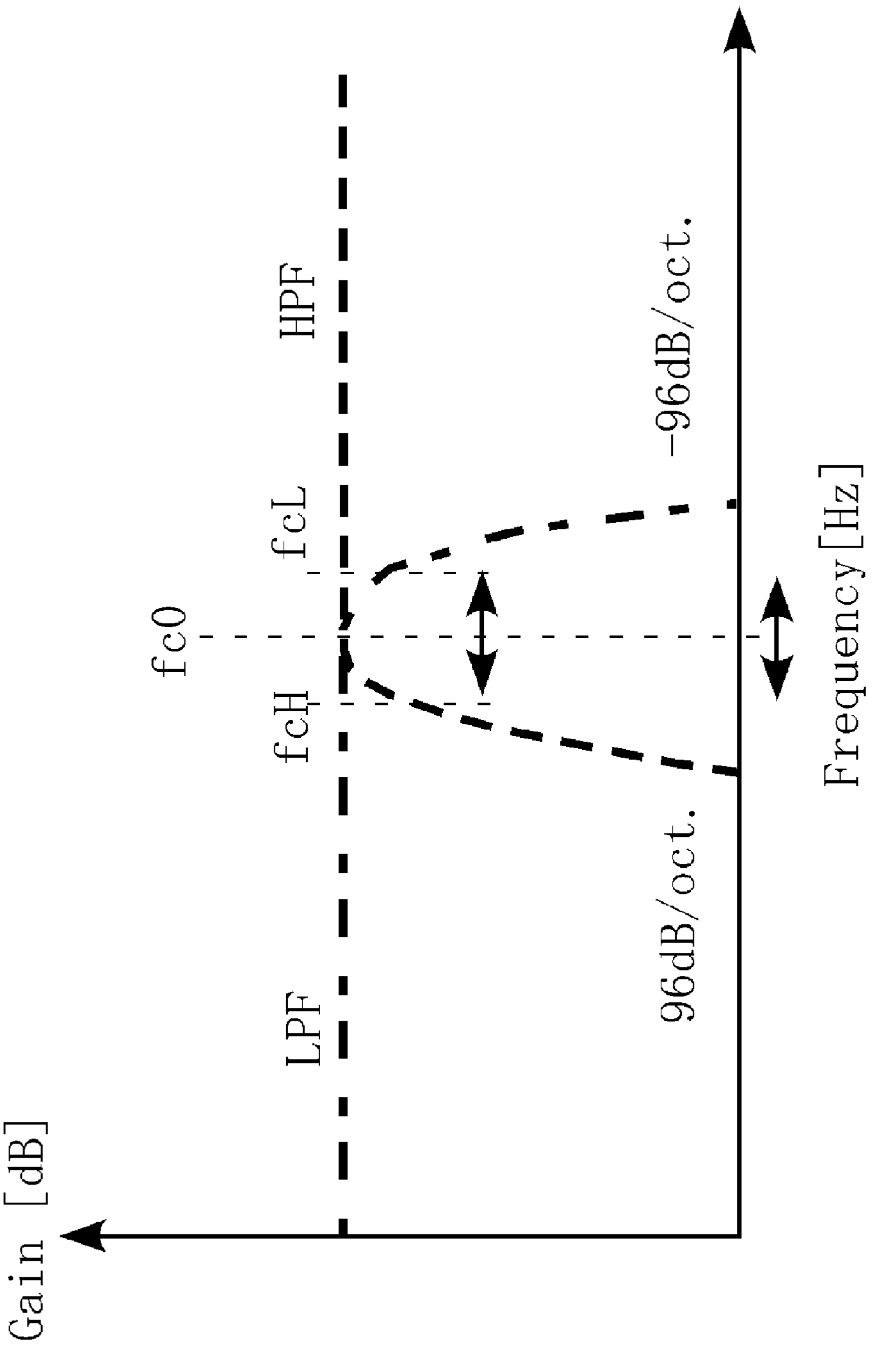
FIG. 5 is a graph describing the crossover characteristic of the channel divider 12 in the amplifier device 1 (the case where the cutoff frequency fcH of the high-pass filter HPF is set to be lower than the cutoff frequency fcL of the low-pass filter LPF); (first embodiment)
Figure 6:
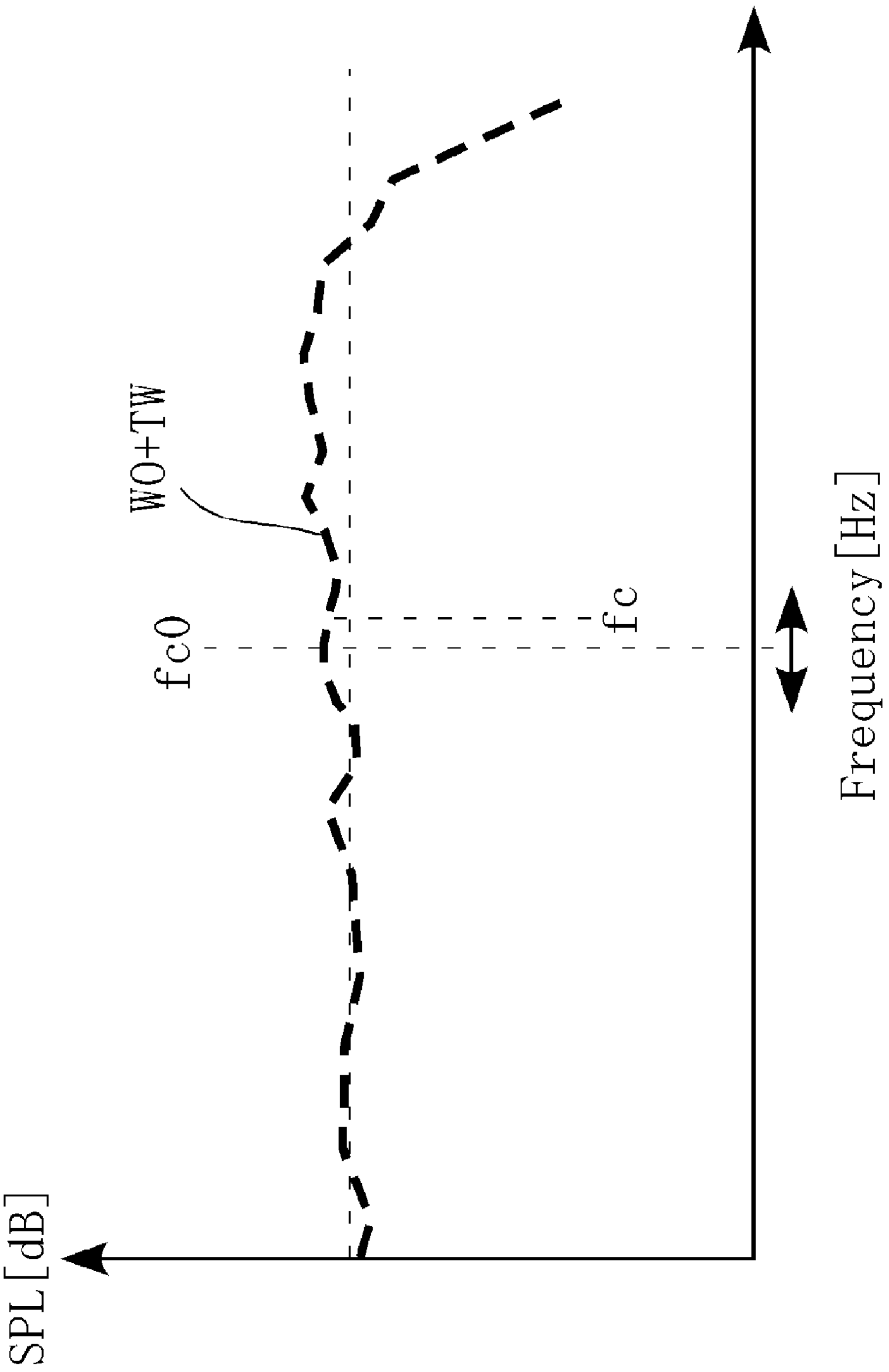
FIG. 6 is a graph describing the sound pressure frequency characteristic of the speaker system 8 in the case where the channel divider 12 of the amplifying device 1 is used (the case where the cutoff frequency fcH of the high-pass filter HPF is set to be lower than the cutoff frequency fcL of the low-pass filter LPF); (first embodiment)

FIG. 1 is a diagram describing the sound reproducing system according to a preferred embodiment of the present invention. Concretely, the sound reproducing system includes an amplifier device 1 having the channel divider, a speaker system 8 and a microphone 9 connected to the amplifier device 1. FIG. 1 is a block diagram illustrating their internal constitutions. FIGS. 2, 4 and 6 are graphs describing a sound pressure frequency characteristic of the speaker system 8, and FIGS. 3 and 5 are graphs describing a crossover characteristic of the channel divider in the amplifier device 1. Illustration and description of some constitutions and internal structures that are not necessary for the description will be omitted.

The sound reproducing system includes the amplifier device 1 and the speaker system 8 to be connected to the amplifier device 1. The sound reproducing system converts digital signal data adata input into the amplifier device 1 into stereo sound signals L and R, and amplifies the sound signals L and R through the amplifier device 1 so as to reproduce a stereo sound through the speaker system 8 composed of two speakers 8L and 8R. The amplifier device 1 includes a DSP and a multi amplifier, and enables multi-amplifier connection for operating the channel divider. The speaker system 8 is two-way biwiring SS including a woofer WO and a tweeter TW, and is biwiring-connected to the amplifier device 1 via a speaker cord. Therefore, a user of the amplifier device 1 can adjust the channel divider to change a frequency band where the woofer and the tweeter carry out reproduction in an overlapped manner and a reproduction level, and can adjust reproduction quality of the speaker system 8.

The amplifier device 1 includes at least a DSP (digital signal processor) 10, a D/A converter 2 and an amplifying circuit 3. The DSP 10 executes a signal process on the digital signal data adata. The D/A converter 2 converts outputs for 4 channels of the DSP 10 into analog signals. The amplifying circuit 3 amplifies these analog signals so as to output them to the speaker system 8. The stereo sound signals L and R may be supplied as analog stereo signals (a left signal L and a right signal R) (not shown) via an A/D converter to the DSP 10. The amplifier device 1 includes a CPU 4, an operating section 5, a display circuit 6, and a microphone amplifying circuit 7. The CPU 4 is a control circuit for entirely making a control. The operating section 5 is connected to the CPU 4 so as to accept an instruction input by the user. The display circuit 6 includes a display. The microphone amplifying circuit 7 is connected to the microphone 9. Concretely, the amplifier device 1 is composed of the DSP compatible with multi-channel sound and an AV receiver containing a multichannel amplifying circuit. The operating section 5 includes an input device such as a switch, a jog dial or a remote control device. The display circuit 6 may be a built-in FL display or a liquid crystal display, or another display device to be connected. Certainly, the amplifier device 1 may be composed of another sound reproducing device including the DSP 10, the D/A converter 2, the multi-channel amplifying circuit 3, and the CPU 4 such as a microcomputer. As described later, the microphone 9 that is connected to a microphone terminal M of the amplifier device 1 does not have to be necessarily provided.

The speaker system 8 is the two-way biwiring SS including the woofer WO and the tweeter TW, and includes network circuits and input terminals corresponding to the respective speaker units. The woofers WO for low-pitched reproduction in the left speaker 8L and the right speaker 8R are connected to an input terminal tL and a network circuit nL. Further, the tweeter TW for high-pitched reproduction is connected to an input terminal tH and a network circuit nH. The network circuit nL as well as the woofer WO composes a low-pass filter LPF for passing through a low-pitched range. The network circuit nH as well as the tweeter TW composes the high-pass filter HPF for passing through a high-pitched range. The network circuits nL and nH are analog filters composed of a coil, a resistor and a capacitor.

FIG. 2 is a graph describing the sound pressure frequency characteristic of the speaker system 8. The woofers WO and the tweeter TW of the speaker system 8 according to this embodiment divide a frequency band mainly for sound reproduction around the crossover frequency fc through the network circuits nL and nH. The network circuit nL is a secondary LPF filter showing a transition range characteristic of −12 dB/Oct. at a frequency higher than the crossover frequency fc. The network circuit nH is a secondary HPF filter showing a transition range characteristic of 12 dB/Oct. at a frequency lower than the crossover frequency fc. Therefore, the woofer WO for low-pitched reproduction carries out reproduction mainly at a frequency range of the crossover frequency fc or less, and the tweeter TW carries out reproduction mainly at a frequency band of the crossover frequency fc or more. The speaker system 8 is adjusted so as to realize the comparatively flat synthesized sound pressure frequency characteristic (WO+TW shown in the drawing) when the same signals are input by using the network circuits nL and nH (namely, the input terminals tL and tH are connected so that input is carried out). In this embodiment, the crossover frequency fc is about 1.8 kHz. Since the network circuits nL and nH of the speaker system 8 are the secondary filters showing gentle transition range characteristic, as show in FIG. 2, as to a reproduction sound of the speaker system 8 around the crossover frequency fc, a reproduction sound from the woofer WO and a reproduction sound from the tweeter TW are widely overlapped with each other.

The DSP 10 includes a decoder 11 for converting input data adata into stereo signals L and R, the channel divider 12 including digital filters, and a test signal source 13 that is connected to the decoder 11 and inputs a test signal instead of the stereo signals (the left signal L and the right signal R) to the channel divider 12. The DSP 10 outputs output terminals (DL1, DL2, DR1 and DR2) for four channels of the channel divider 12 to the D/A converter 2. The channel divider 12 includes the low-pass filter LPF and the high-pass filter HPF corresponding to the left signal L and the right signal R, respectively, and switches SW1 to SW4. Setting in the low-pass filter LPF and the high-pass filter HPF of the channel divider 12 in the DSP 10 and switching of the switches SW1 to SW4 are controlled by the CPU 4.

The low-pass filter LPF and the high-pass filter HPF of the channel divider 12 are digital filters composed of FIR filters or IIR filters. The low-pass filter LPF and the high-pass filter HPF are preferably Butterworth filters or Linkwitz-Riley filters, and may include a linear-phase characteristic due to FIR filters. The low-pass filter LPF and the high-pass filter HPF may include a level control circuit (not shown) for controlling a level, a phase inverter (not shown) for inverting a phase, and a delay circuit (not shown) for adjusting a delay time in order to cope with widening of a reproduction sound quality adjusting range and the wide biwiring SS.

The switch SW1 switches a signal to be input into the high-pass filter HPF between branch of an input signal to the low-pass filter LPF and an output to the low-pass filter LPF. The switch SW2 switches whether the output from the low-pass filter LPF is output to first output terminals (DL1, DR1). The switch SW3 switches whether the output from the high-pass filter HPF is output to second output terminals (DL2, DR2) connected to the D/A converter 2 on the high-pitched side or output terminals (DL1, DR1) connected to the D/A converter 2 on the low-pitched side. The switch SW4 switches between short circuit and open between the output terminals (DL1, DL2) and between the output terminals (DR1, DR2).

The switches SW1 to SW4 of the channel divider 12 perform switching operations so that the low-pass filter LPF and the high-pass filter HPF are connected in parallel as shown in FIG. 1 at a time of normal sound reproduction, input signals are supplied, and the outputs from the low-pass filter LPF and the high-pass filter HPF are output to the D/A converters 2. That is to say, the switch SW1 is closed, so that the same input signal as the branched input signal to the low-pass filter LPF is input into the high-pass filter HPF. The switches SW2 and SW3 are closed, so that the output form the low-pass filter LPF is output to the first output terminals (DL1, DR1), and the output from the high-pass filter HPF is output to the second output terminals (DL2, DR2). The switch SW4 is opened. In this embodiment, the above switch connecting state for operating the channel divider 12 to reproduce a sound is "normal sound reproducing mode". In the "normal sound reproducing mode", the user operates the channel divider 12, and while checking a sound obtained by synthesizing a sound reproduced from the woofer WO of the speaker system 8 and a sound reproduced from the tweeter TW, can adjust reproduction sound quality.

The switches SW2 and SW3 switch On/Off so as to operate the channel divider 12 in "a band-specific sound output mode". In the band-specific sound output mode, the output from the low-pass filter LPF can be output only to the output terminals (DL1, DR1), or the output from the high-pass filter HPF can be output only to the output terminals (DL2, DR2). The switch SW2 is closed to output the output from the low-pass filter LPF to the output terminals (DL1, DR1), and when the switch SW3 is opened, a sound is reproduced only from the woofer WO of the speaker system 8. On the other hand, when the switch SW2 is opened and the switch SW3 is closed so that the output from the high-pass filter HPF is output to the output terminals (DL2, DR2), a sound is reproduced only from the tweeter TW of the speaker system 8. The user checks a difference between the sound reproduced from the woofer WO of the speaker system 8 and the sound reproduced from the tweeter TW and simultaneously can adjust the reproduction sound quality in the band-specific sound output mode.

FIG. 3 is a graph describing the crossover characteristic of the channel divider 12 in the amplifier device 1. FIG. 3 is a graph describing a case where the cutoff frequency fcL of the low-pass filter LPF and the cutoff frequency fcH of the high-pass filter HPF are set to be equal to each other in the normal sound reproducing mode, and a crossover frequency fc0 is set. The low-pass filter LPF is an LPF filter showing a transition range characteristic of −96 dB/Oct. at a frequency higher than the crossover frequency fc0. The high-pass filter HPF is an HPF filter showing the transition range characteristic of 96 dB/Oct. at a frequency lower than the crossover frequency fc. In the graph of FIG. 3, in the crossover frequency fc0 to be set, output characteristics of the low-pass filter LPF and the high-pass filter HPF cross at a level that is −6 dB of pass ranges of the low-pass filter LPF and the high-pass filter HPF. As described later, a case where the cutoff frequency fcL of the low-pass filter LPF and the cutoff frequency fcH of the high-pass filter HPF are set to be equal to each other is "without overlap".

FIG. 4 is a graph describing the sound pressure frequency characteristic of the speaker system 8 in a case where the channel divider 12 of the amplifier device 1 is used. In FIG. 3 and FIG. 4, the crossover frequency fc0 of the channel divider 12 is higher than the crossover frequency fc (=1.8 kHz) of the network circuit of the speaker system 8, namely, about 2.0 kHz. That is to say, in the normal sound reproducing mode, in a case of "without overlap" where the cutoff frequency fcL of the low-pass filter LPF and the cutoff frequency fcH of the high-pass filter HPF are set to be equal to each other (=fc0), dip is occasionally generated in the synthesized sound pressure frequency characteristic (WO+TW shown in the drawing) of the speaker system 8 as shown in FIG. 4. This is a problem that arises when the crossover frequency fc0 to be set in the channel divider 12 does not match and shifts with respect to the crossover frequency fc of the network circuit in the speaker system 8 as the biwiring SS. This is because in the sound reproducing system, a band division filter of the channel divider 12 in the amplifier device 1 and a band division filter of the network circuit of the speaker system 8 are connected in series. When the crossover frequency fc0 set by the channel divider 12 shifts from the crossover frequency fc of the biwiring SS "without overlap", the dip on the sound pressure frequency characteristic is large and a band where reproduction is not suitably carried out is occasionally widened. When the filter set in the channel divider 12 becomes steep, the dip is occasionally deep.

FIG. 5 is a graph describing the crossover characteristic of the channel divider 12 in the amplifier device 1, and a case of "with overlap" where the cutoff frequency fcL of the low-pass filter LPF and the cutoff frequency fcH of the high-pass filter HPF are set to be different from each other. In FIG. 5, when the crossover frequency fc0 for defining band division is specified in the normal sound reproducing mode, the cutoff frequency fcL of the low-pass filter LPF is set to be higher than the crossover frequency fc0 by about ⅓ Oct., and the cutoff frequency fcH of the high-pass filter HPF is set to be lower than the crossover frequency fc0 by about ⅓ Oct. For example, when the crossover frequency fc0 is set to 2 kHz, the cutoff frequency fcL of the low-pass filter LPF is set to 2.5 kHz, and the cutoff frequency fcH of the high-pass filter HPF is set to about 1.6 kHz. The low-pass filter LPF is an LPF filter showing the transition range characteristic of −96 dB/Oct. at a frequency higher than the crossover frequency fc0. Further, the high-pass filter HPF is an HPF filter showing the transition range characteristic of 96 dB/Oct. at a frequency lower than the crossover frequency fc. "Without overlap" or "with overlap" is set in a manner that the CPU 4 controls the DSP 10.

In the graph of FIG. 5, passing regions of the low-pass filter LPF and the high-pass filter HPF are overlapped with each other at the crossover frequency fc0 to be set. When the cutoff frequency fcL of the low-pass filter LPF is set to be higher than the crossover frequency fc0 by about ⅙-1 Oct., the cutoff frequency fcH of the high-pass filter HPF is set to be lower than the crossover frequency fc0 by about ⅙ to 1 Oct. and "with overlap" is set, both the first output terminals (DL1, DR1) of the low-pass filter LPF and the second output terminals (DL2, DR2) of the high-pass filter HPF include frequency bands fcL to fcH. Therefore, a frequency band component around the crossover frequency fc=1.8 kHz in the network circuit of the speaker system 8 is included in both the output terminals (DL1, DR1) of the low-pass filter LPF and the output terminals (DL2, DR2) of the high-pass filter HPF.

FIG. 6 is a graph describing the sound pressure frequency characteristic of the speaker system 8 when the channel divider 12 of the amplifier device 1 of the embodiment is used, and describing the case of the "with overlap" where the cutoff frequency fcL of the low-pass filter LPF and the cutoff frequency fcH of the high-pass filter HPF are set to be different from each other. When the crossover frequency fc0=2 kHz set in the channel divider 12 slightly shifts from the crossover frequency fc=1.8 kHz of the network circuit in the speaker system 8, the setting of the "with overlap" prevents dip from being generated in the synthesized sound pressure frequency characteristic (WO+TW shown in the drawing) of the speaker system 8 as shown in FIG. 6. When the speaker system 8 is the biwiring SS, adjustment is made so that a flat synthesis characteristic is obtained with the network circuits nL and nH being included. For this reason, when the channel divider 12 is set into the normal sound reproducing mode of "with overlap", no dip is generated on the sound pressure frequency characteristic.

Like this embodiment, when the transition range characteristic (±96 dB/Oct.) that is steeper than the transition range characteristic (±12 dB/Oct.) of the network circuit in the speaker system 8 is set in the normal sound reproducing mode "with overlap" of the channel divider 12, attenuation rates of a transition range and an inhibition range become large. For this reason, the adjustment can be made so that the basic sound pressure frequency characteristic of the speaker system 8 is not changed and the reproduction sound quality of the sound reproducing system is changed. Like this embodiment, when a stereo sound is reproduced in the two-way speaker system 8, the reproduction band of a singer's vocal sound is present across the crossover frequency fc. For this reason, when the channel divider 12 sets the steep transition range characteristic, an interference between a reproduced sound wave from the woofer WO and a reproduced sound wave from the tweeter TW substantially reduce, and the user can obtain a sound image such that a level of the singer's vocal is smaller than a case where the channel divider 12 is not functioned.

It is preferable that the crossover frequencies fc of the low-pass filter LPF and the high-pass filter HPF in the channel divider 12 can be set finely, and they may be set, for example, by a step of about ⅓ Oct. or ⅙ Oct. according to the JIS standards (or ISO/IEC standards). In the case of "with overlap", when the cutoff frequency fcL of the low-pass filter LPF is set to be higher than the crossover frequency fc0 by about ⅙ to 1 Oct. and the cutoff frequency fcH of the high-pass filter HPF is set to be lower than the crossover frequency fc0 by about ⅙ to 1 Oct., an effect of sound quality adjustment made by the channel divider 12 is heightened further by narrowing the frequency band where overlap occurs. On the other hand, when the network circuit of the speaker system 8 has a gentle transition range characteristic, the widening of the overlapped frequency band to about 2 Oct. reduces generation of the dip on the sound pressure frequency characteristic.

The channel divider 12, however, is not limited to application to the two-way biwiring SS including the woofer WO and the tweeter TW in the above embodiment. The channel divider 12 may be constituted so as to include a 3 to 5-way band pass filter BPF in odder to cope with the biwiring SS as a 3 to 5-way multiway speaker (not shown) including a subwoofer and/or mid-range and/or a super-tweeter. The band pass filter BPF may be constituted by connecting another high-pass filter HPF or another low-pass filter LPF to the low-pass filter LPF or the high-pass filter HPF in series. That is to say, when the filters are set to "with overlap" between the adjacent filters whose band is divided, even if the channel divider is operated according to the 3 to 5-way biwiring SS, the dip on the sound pressure frequency characteristic can be prevented.

Certainly, in a case of a multi-way speaker including the woofer and the tweeter without using the network circuit, the setting of "with overlap" in the channel divider 12 is effective. Further, also when the speaker system 8 includes a full-range speaker without the network circuit, the setting of "with overlap" is effective similarly. When the substantial crossover frequency fc with respect to another speaker is set according to a decrease in the level caused by a limit of the reproduction sound pressure frequency characteristic of the speaker such as a full-range speaker, a woofer or a tweeter, the crossover frequency fc0 of the channel divider 12 can be set accordingly.

FIGS. 7A to 7D are diagrams describing filter constitutions on a side of the left signal L in a "test signal output mode" of the channel divider 12 in the amplifier device 1 according to the embodiment. In the test signal output mode, the test signal source 13 of the DSP 10 of the amplifier device 1 is operated, and a test signal is input into the channel divider 12 instead of the stereo signals (the left signal L and the right signal R). The test signal may be any one of a noise signal such as a white noise or a pink noise having a predetermined frequency band component, a sweep signal obtained by sweeping a pure sound, and an impulse signal. Since the filter constitution on the side of the right signal R is similar, illustration and description thereof will be omitted.

In the test signal output mode of the amplifier device 1, even when the crossover frequencies fc set in the network circuits nL and nH of the speaker system 8 as the biwiring SS are unknown, the user operates the test signal source 13 including a predetermined band of the DSP 10 of the amplifier device 1 in the test signal output mode, and changes an open/close state of the switches SW1 to SW4 for changing the connection of the low-pass filter LPF and the high-pass filter HPF so as to be capable of knowing the unknown crossover frequencies fc. As shown in FIGS. 7A to 7D, the CPU 4 changes the open/close states of the switches SW1 to SW4, executes a filter process on the test signal from the test signal source 13, so as to output the processed signal from the output terminals DL1 and DL2 to the speaker system 8.

In the test signal output mode, similarly to the case of "with overlap" in the normal sound reproducing mode of the embodiment, the low-pass filter LPF and the high-pass filter HPF are set. That is to say, similarly to the case shown in FIG. 6, the output from the low-pass filter LPF and the output from the high-pass filter HPF include frequency bands fcL to fcH between the cutoff frequency fcL of the low-pass filter LPF and the cutoff frequency fcH of the high-pass filter HPF. Therefore, description about the setting of the low-pass filter LPF and the high-pass filter HPF will be omitted.

Figure 7:
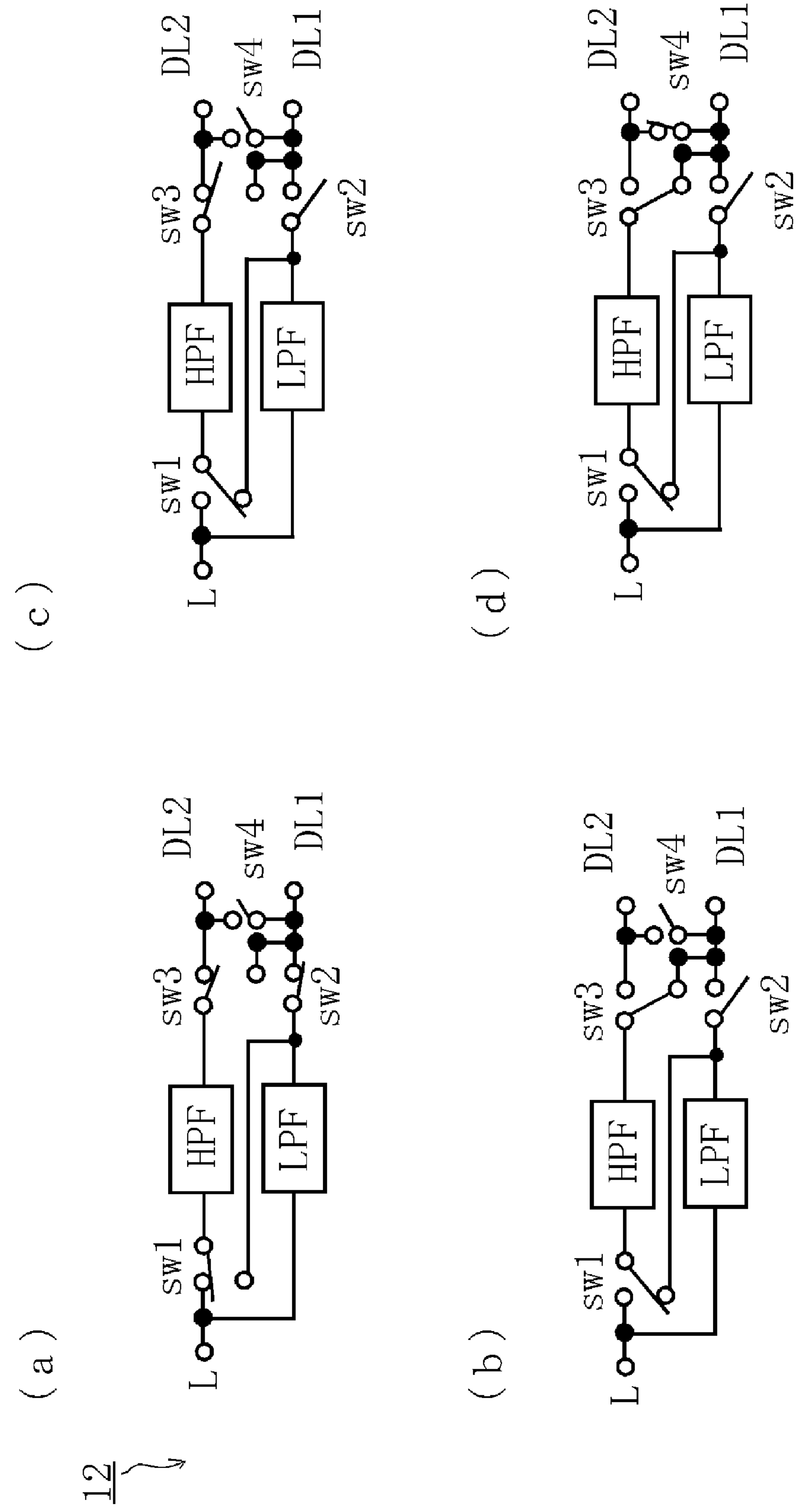
FIGS. 7A to 7D are diagrams describing filter structures in a test signal output mode of the channel divider 12 in the amplifier device 1 according to the preferred embodiment of the present invention; (second embodiment)

In FIG. 7A, the open/close states of the switches SW1 to SW4 are the same as those in the case of the normal sound reproducing mode shown in FIGS. 1 to 6. Therefore, the user operates the channel divider 12 even in the test signal output mode, and while checking a synthesized sound of a sound from the test signal reproduced from the woofer WO of the speaker system 8 and a sound from the test signal reproduced from the tweeter TW, can adjust reproduction sound quality. Needless to say, like the band-specific sound output mode, the short circuit/open of the switches SW2 and SW3 is switched, so that while checking a difference between the sound from the test signal reproduced from the woofer WO of the speaker system 8 and the sound from the test signal reproduced from the tweeter TW, the user can adjust the reproduction sound quality in the case where the channel divider 12 is operated.

In the test signal output mode of the amplifier device 1, as shown in FIGS. 7B to 7D, the switch SW1 is switched so that a signal to be input into the high-pass filter HPF is to be an output from the low-pass filter LPF. Further, the switch SW2 is opened and switched so that the output from the low-pass filter LPF is not output to the output terminals (DL1, DR1). As a result, the narrow band pass filter BPF is constituted so that the low-pass filter LPF and the high-pass filter HPF are connected in series. When the channel divider 12 is operated in the normal sound reproducing mode, the crossover frequency fc0 to be suitably set is a center frequency of the narrow band pass filter BPF.

Therefore, when the center frequency fc0 of the narrow band pass filter BPF approximately matches with the crossover frequencies fc of the network circuits nL and nH of the speaker system 8 as the biwiring SS, a sound pressure level reproduced from the woofer WO approximately matches with a sound pressure level reproduced from the tweeter TW. Therefore, in the test signal output mode of the amplifier device 1, a step of changing the crossover frequency fc0 set by the channel divider 12 is repeated so that a frequency where the sound pressure level reproduced from the woofer WO approximately matches with the sound pressure level reproduced from the tweeter TW can be checked. For this reason, the unknown crossover frequency fc of the speaker system 8 as the biwiring SS can be understood.

That is to say, in the test signal output mode of the amplifier device 1, a test signal including a predetermined band signal is allowed to pass through the narrow band pass filter BPF, and the switching is made so that the output from the narrow band pass filter BPF is output only from the output terminal DL1 as shown in FIG. 7B, or the output from the narrow band pass filter BPF is output only from the output terminal DL2 as shown in FIG. 7C, or the output from the narrow band pass filter BPF is output from both the output terminals DL1 and DL2 as shown in FIG. 7D. As a result, when the sound pressure level reproduced from the woofer WO of the speaker system 8 is compared with the sound pressure level reproduced from the tweeter TW, even if the crossover frequency fc of the speaker system 8 is unknown, the crossover frequency fc0 of the channel divider 12 that matches with the crossover frequency fc can be set.

The narrow band pass filter BPF that is constituted by connecting the low-pass filter LPF and the high-pass filter HPF having steep transition range characteristic in series allows a test signal only within a range of 2/6 to 2 Oct. including the crossover frequency fc0 as the center frequency to pass therethrough. For this reason, when the setting of the crossover frequency fc0 is unsuitable, the sound pressure level is clearly different according to gain characteristics of the network circuits nL and nH of the speaker system 8. When the crossover frequency fc0 to be set is lower than the unknown crossover frequency fc of the speaker system 8, the sound pressure level reproduced from the woofer WO is higher than the sound pressure level reproduced from the tweeter TW. In another manner, when the crossover frequency fc0 to be set is higher than the unknown crossover frequency fc of the speaker system 8, the sound pressure level reproduced from the woofer WO is lower than the sound pressure level reproduced from the tweeter TW.

When the center frequency fc0 of the narrow band pass filter BPF approximately matches with the crossover frequencies fc of the network circuits nL and nH, the sound pressure level reproduced from the woofer WO approximately matches with the sound pressure level reproduced from the tweeter TW. Therefore, the user can change the crossover frequency fc0 so that the crossover frequency fc0 can approximately match with the unknown crossover frequencies fc of the network circuits nL and nH of the speaker system 8 relying on an acoustical level of a sound even without using the microphone 9. When the crossover frequency set by the channel divider does not shift from the crossover frequency of the biwiring SS, the dip is not generated on the sound pressure frequency characteristic, and a sound can be suitably reproduced. Since the user can understand the unknown crossover frequency of the biwiring SS without a microphone and a measuring device such as a level meter or an FFT analyzer, the channel divider can be functioned so that the reproduction sound quality can be properly adjusted.

FIGS. 8A to 8D are diagrams describing the display circuit 6 of the amplifier device 1 according to the embodiment. Further, FIG. 9 is a flowchart describing an operation of the channel divider 12 of the amplifier device 1 in the test signal output mode. Even when the crossover frequency fc of the speaker system 8 as the biwiring SS is unknown, the amplifier device 1 in the embodiment can suitably set the crossover frequency fc0 of the channel divider 12 in "the test signal output mode" of the channel divider 12 using the microphone 9 connected to the microphone amplifying circuit 7. Since "the test signal output mode" of the channel divider 12 is similar to that in the above embodiment, overlapped description about this will be omitted.

The microphone amplifying circuit 7 includes an amplifying stage 71 for amplifying an input signal from the microphone 9, and an output circuit 72 for executing a filter process so that an output from the amplifying stage 71 is output to the CPU 4. Therefore, the CPU 4 of the amplifier device 1 detects a sound signal, that synchronizes with a test signal generated from the test signal source 13 in the test signal output mode and is detected from the microphone 9, as a reproduced sound of the test signal, so as to be capable of displaying it on the display circuit 6. In the test signal output mode, the display circuit 6 displays at least a window display 80 showing the crossover frequency fc0 to be set, a reproduction sound pressure level 81 of a test signal from the woofer WO of the speaker system 8 that is measured, a reproduction sound pressure level 82 of a test signal from the tweeter TW that is measured, and a reproduction sound pressure level 83 of test signals that are reproduced from the woofer WO and the tweeter TW simultaneously and are synthesized. The display circuit 6 displays a window display 84 suggesting that the crossover frequency fc0 is changed. The reproduction sound pressure levels 81 to 83 of the test signals may be displayed in a format of bars as shown in FIGS. 8A to 8D for the user.

Figure 8:
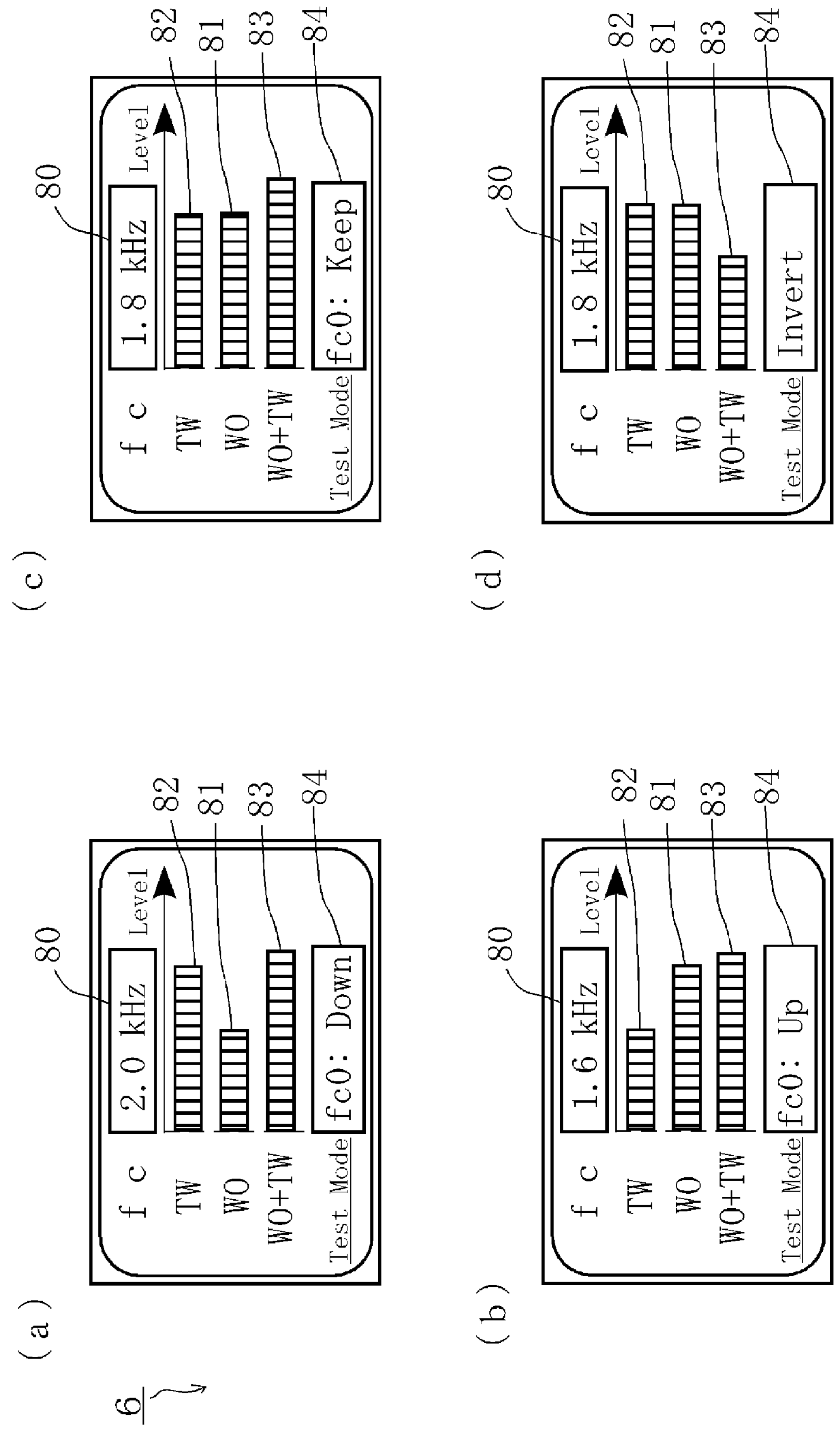
FIGS. 8A to 8D are diagrams describing a display circuit 6 of the amplifier device 1 according to another preferred embodiment of the present invention; (third embodiment)
Figure 9:
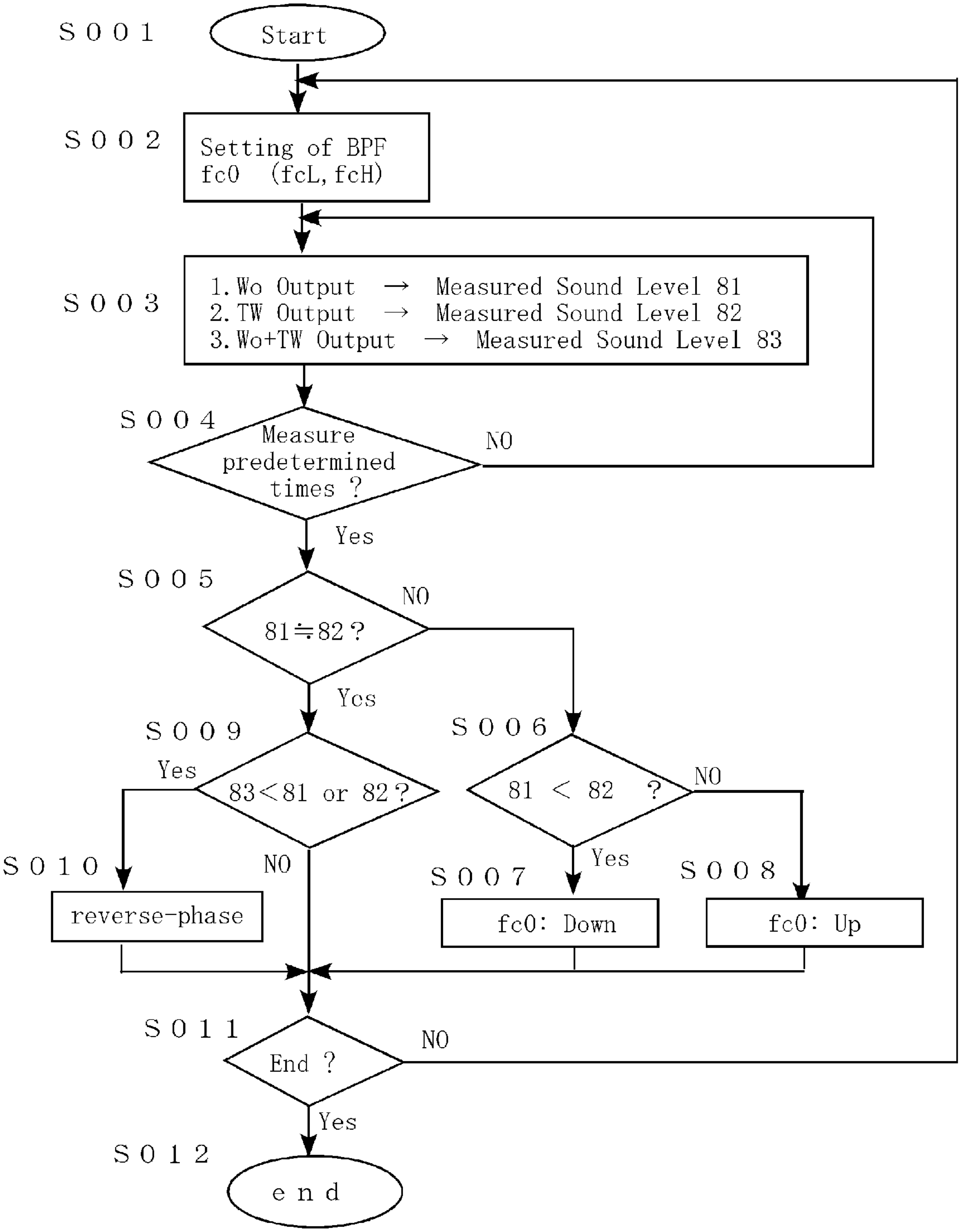
FIG. 9 is a flowchart describing an operation in the test signal output mode of the channel divider 12 in the amplifier device 1 according to the preferred embodiment of the present invention. (third embodiment)

For example, FIG. 8A is a diagram describing the display circuit 6 in a case where the user operates the operating section 5 of the amplifier device 1 to set the crossover frequency fc0 of the channel divider 12 to 2.0 kHz. In the test signal output mode, when a test signal including a predetermined band signal is allowed to pass through the narrow band pass filter BPF and is switched to be output as shown in FIGS. 7B to 7D, the sound pressure level 81 of the test signal reproduced from the woofer WO of the speaker system 8, the sound pressure level 82 of the test signal reproduced from the tweeter TW, and the sound pressure level 83 of the test signals that are reproduced from the woofer WO and the tweeter TW simultaneously and synthesized can be measured and displayed. In the case of FIG. 8A, the sound pressure level 81 of the test signal reproduced from the woofer WO is smaller than the sound pressure level 82 of the test signal reproduced from the tweeter TW. In this case, since the crossover frequency fc0 of the channel divider 12 is higher than the crossover frequency fc (=1.8 kHz) of the speaker system 8, the window display 84 of the display circuit 6 is displayed to suggest that the crossover frequency fc0 is changed to be low (i.e., down).

FIG. 8B is a diagram describing the display circuit 6 in a case where the user operates the operating section 5 of the amplifier device 1 so as to set the crossover frequency fc0 of the channel divider 12 to 1.6 kHz. In the case of FIG. 8B, the sound pressure level 81 of the test signal reproduced from the woofer WO is larger than the sound pressure level 82 of the test signal reproduced from the tweeter TW. In this case, since the crossover frequency fc0 of the channel divider 12 is lower than the crossover frequency fc (=1.8 kHz) of the speaker system 8, the window display 84 of the display circuit 6 is displayed so as to suggest that the crossover frequency fc0 is changed to be high (i.e., up).

FIG. 8C is a diagram describing the display circuit 6 in a case where the user operates the operating section 5 of the amplifier device 1 so as to set the crossover frequency fc0 of the channel divider 12 to 1.8 kHz. In the case of FIG. 8C, the sound pressure level 81 of the test signal reproduced from the woofer WO is approximately equal to the sound pressure level 82 of the test signal reproduced from the tweeter TW. Further, the reproduction sound pressure level 83 of the test signals simultaneously reproduced from the woofer WO and the tweeter TW and synthesized is larger than the independent sound pressure level 81 or 82 of the woofer WO and the tweeter TW. Therefore, a reproduction sound wave from the woofer WO and a reproduction sound wave from the tweeter TW can be estimated to be in an in-phase relationship on a position of the microphone 9. In this case, since the crossover frequency fc0 of the channel divider 12 approximately matches with the crossover frequency fc (=1.8 kHz) of the speaker system 8 and are in a preferable in-phase relationship, the window display 84 of the display circuit 6 is displayed so as to suggest that the crossover frequency fc0 is kept (i.e., keep).

FIG. 8D is a diagram describing the display circuit 6 in a case where the user operates the operating section 5 of the amplifier device 1 so as to set the crossover frequency fc0 of the channel divider 12 to 1.8 kHz. In a case of FIG. 8C, the sound pressure level 81 of a test signal reproduced from the woofer WO is approximately equal to the sound pressure level 82 of a test signal reproduced from the tweeter TW, but the reproduction sound pressure level 83 of test signals reproduced from the woofer WO and the tweeter TW simultaneously and synthesized is smaller than the independent sound pressure level 81 or 82 of the woofer WO or the tweeter TW. Since a reproduction sound wave from the woofer WO and a reproduction sound wave from the tweeter TW can be estimated to be in a reverse-phase relationship on the position of the microphone 9 so as to be cancelled, it is preferable that any one of the woofer WO and the tweeter TW is reverse-phase-connected. Therefore, the window display 84 of the display circuit 6 is displayed to suggest that the connection is inverted into the reverse-phase connection.

Therefore, even when the crossover frequency fc of the speaker system 8 is unknown, the user repeats an operation for changing the crossover frequency fc0 set by the channel divider 12 of the amplifier device 1 according to the suggestion of the window display 84 of the display circuit 6 so as to be capable of setting the crossover frequency fc0 of the channel divider 12 so that the frequency fc0 approximately matches with the crossover frequency fc. Further, when the crossover frequency fc0 can be set suitably, the user can understand whether the woofer WO and the tweeter TW are preferably changed into the in-phase connection or the reverse-phase connection. For this reason, when sound reproduction is carried out in the normal sound reproducing mode, the phase inverters of the low-pass filter LPF and the high-pass filter HPF of the channel divider 12 are adjusted so that dip generated on the sound pressure frequency characteristic can be prevented. Needless to say, the level control circuits and the delay circuits of the low-pass filter LPF and the high-pass filter HPF may be adjusted respectively.

In this embodiment, the user operates the operating section 5 of the amplifier device 1 so as to change the crossover frequency fc0 of the channel divider 12, but the CPU 4 may automatically change the crossover frequency fc0. As shown in a flowchart of FIG. 9, the CPU 4 can control the operation of the channel divider 12 of the amplifier device 1 in the test signal output mode. When the crossover frequencies fc of the network circuits nL and nH of the speaker system 8 are unknown, the operation moves from the normal sound reproducing mode of the channel divider 12 to the test signal output mode and this operation is started (S001). The CPU 4 firstly connects the low-pass filter LPF and the high-pass filter HPF of the channel divider 12 in series so as to set the narrow band pass filter BPF (S002).

The CPU 4 operates the test signal source 13 including a predetermined band of the DSP 10, and switches the open/close states of the switches SW1 to SW4 for changing the connection of the low-pass filter LPF and the high-pass filter HPF (S003). For example, the switches SW1 to SW4 are switched so that after a mute operation for a predetermined time, (1) the output from the narrow band pass filter BPF is output only from the output terminal DL1 to the woofer WO continuously for a predetermined time as shown in FIG. 7B, after the mute operation for a predetermined time, (2) the output is output from only the output terminal DL2 to the tweeter TW continuously for a predetermined time as shown in FIG. 7C, and after the mute operation for further predetermined time, (3) the output is output from both the output terminal DL1 and the output terminal DL2 continuously for a predetermined time as shown in FIG. 7D. When the sound pressure level of the test signal is repeatedly measured at a predetermined number of times by using the microphone 9 (S004:No) and the measurement is repeated at the predetermined number of times or more (S004:Yes), a check is made whether the measured sound pressure level 81 of the test signal reproduced from the woofer WO is approximately equal to the sound pressure level 82 of the test signal reproduced from the tweeter TW (S005).

When the measured sound pressure level 81 of the test signal reproduced from the woofer WO is different from the sound pressure level 82 of the test signal reproduced from the tweeter TW (S005:No), the CPU 4 compares them (S006). When the sound pressure level 81 from the woofer WO is lower than the sound pressure level 82 from the tweeter TW (S006:Yes), the CPU 4 changes to make the crossover frequency fc0 set by the channel divider 12 lower (S007). On the other hand, when the sound pressure level 81 from the woofer WO is higher than the sound pressure level 82 from the tweeter TW (S006:Yes), the CPU 4 changes to make the crossover frequency fc0 set by the channel divider 12 higher (S008). The CPU 4 determines whether the test signal output mode is ended (S011), when it is not ended (S011:No), the sequence returns to the step (S002) of setting the narrow band pass filter BPF, and the step is repeated until the crossover frequency fc0 of the channel divider 12 approximately matches with the crossover frequency fc of the speaker system 8.

As a result, when the measured sound pressure level 81 of the test signal reproduced from the woofer WO approximately matches with the sound pressure level 82 of the test signal reproduced from the tweeter TW (S005:Yes), the CPU 4 can confirm the crossover frequency fc0 that should be set by the channel divider 12. For this reason, the CPU 4 determines whether the reproduction sound pressure level 83 of the test signals reproduced simultaneously from the woofer WO and the tweeter TW and synthesized is smaller than the independent sound pressure level 81 or 82 of the woofer WO or the tweeter TW (S009). When the synthesized reproduction sound pressure level 83 of the woofer WO and the tweeter TW is larger than the independent sound pressure level 81 or 82 (S009:No), the reproduction sound wave from the woofer WO and the reproduction sound wave from the tweeter TW are in the in-phase relationship on the position of the microphone 9. For this reason, the CPU 4 automatically ends the step of changing the crossover frequency fc0 (S011:Yes).

On the other hand, when an absolute value of a level difference between them is larger than a predetermined value (S009:Yes), the reproduction sound wave from the woofer WO and the reproduction sound wave from the tweeter TW are estimated to be in the reverse-phase relationship on the position of the microphone 9 and are cancelled. For this reason, the CPU 4 sets the phase inverters of the low-pass filter LPF and the high-pass filter HPF so that any one of the woofer WO and the tweeter TW is changed into the reverse-phase connection (S010). Thereafter, the CPU 4 determines whether the test signal output mode is ended (S011), and when not ended (S011: No), the sequence returns to the step of setting the narrow band pass filter BPF (S002), and the step is repeated until the crossover frequency fc0 of the channel divider 12 approximately matches with the crossover frequency fc of the speaker system 8. When the test signal output mode is ended (S011:Yes), the CPU 4 automatically ends the step of changing the crossover frequency fc0 (S012).

In the test signal output mode of the channel divider 12 in the amplifier device 1 of this embodiment, the CPU 4 that controls this mode displays the suggestion that the crossover frequency fc0 is changed on the display circuit 6, and the user operates the operating section 5 to change the crossover frequency fc0 or CPU4 automatically changes the crossover frequency fc0. However, they may be partially combined so as to compose the test signal output mode. For example, when the CPU 4 determines that any one of the woofer WO and the tweeter TW is preferably changed into the reverse-phase connection, it switches between the in-phase connection and the reverse-phase connection at a predetermined number of times so as to automatically measure a test signal sound, and thereafter the user may determine to finally select the in-phase connection or the reverse-phase connection. Further, when the setting of the channel divider 12 in the test signal output mode is changed, just after the user operates the operating section 5, the operation moves to the normal sound reproducing mode, so that the user may reproduce and listen to a sound signal of a music to check if the channel divider 12 is suitably set.

Further, the connecting constitution including the switches SW1 to SW4 of the channel divider 12 is not limited to the constitution described and illustrated in the above embodiment. That is to say, the switches SW1 to SW4 may be any other combination of switches as long as they are switched so that a test signal including a predetermined band signal passes through the narrow band pass filter BPF in the test signal output mode of the amplifier device 1 and the output from the narrow band pass filter BPF is output only from the first output terminal DL1 or only from the second output terminal DL2 or from both the output terminal DL1 and the output terminal DL2. Further, a multiplier in a signal flow of the DSP 10 composing the channel divider 12 may be used as substitute for the switches SW1 to SW4. When a multiplier coefficient of the multiplier is set to 1, a short circuit occurs, and when the multiplier coefficient is set to 0, the state is equivalent to open.

Particularly, when the channel divider 12 of the present invention uses the biwiring-connectable speaker system 8 including network circuit, the crossover frequency fc of the channel divider 12 can be suitably set. Therefore, the user can reproduce a sound satisfactorily without a dip on the sound pressure frequency characteristic. When the channel divider 12 selectively reproduces a test signal output of the narrow band pass filter BPF, and can compare the sound pressure level reproduced from the woofer WO of the speaker system 8 with the sound pressure level reproduced from the tweeter TW, even if the crossover frequency fc of the speaker system 8 is unknown, the crossover frequency fc0 that matches with the crossover frequency fc can be set.

The channel divider of the present invention can be applied not only to a stereo device for reproducing a stereo sound signal but also to the sound reproducing system including a multi-channel surround sound reproducing device.

What is claimed is:

1. A channel divider, comprising:

a digital signal processor DSP including a low-pass filter LPF and a high-pass filter HPF for dividing a band of an input sound signal into at least a first output signal whose frequency is lower and a second output signal whose frequency is higher than that of the first output signal and outputting them to a first output terminal and a second output terminal;

a control circuit for controlling the digital signal processor DSP and the filters; and a sound output mode in which when any crossover frequency fc0 for defining the band division is specified, the control circuit sets a cutoff frequency fcL of the low-pass filter LPF to a value higher than the crossover frequency fc0 by about ⅙ to 1 Oct., and sets a cutoff frequency fcH of the high-pass filter HPF to a value lower than the crossover frequency fc0 by about ⅙ to 1 Oct., so as to output the first output signal and the second output signal including frequency bands fcL to fcH to the first output terminal and the second output terminal, respectively.

2. The channel divider according to claim 1, further comprising:

a test signal generating circuit included in the digital signal processor DSP for generating a test signal including a predetermined band; and a test signal output mode in which the control circuit allows the test signal to pass through a narrow band pass filter BPF constituted by connecting the low-pass filter LPF and the high-pass filter HPF in series, and switches to output the output signal from the narrow band pass filter BPF only from the first output terminal or only from the second output terminal or from both the first output terminal and the second output terminal.

3. The channel divider according to claim 2, wherein each of the low-pass filter LPF and the high-pass filter HPF includes;

a level control circuit for adjusting a level of the first output signal or the second output signal, a phase inverter for inverting a phase of the first output signal or the second output signal, and a delay circuit for adjusting a delay time of the first output signal or the second output signal.

4. The channel divider according to claim 2, further comprising:

a microphone for converting a sound into a sound signal so as to input it as a measured signal to the control circuit; and a display circuit for displaying a level of the measured signal from the microphone, wherein in the test signal output mode, the control circuit compares a first measurement level that is measured when the test signal as the output from the narrow band pass filter BPF is output only from the first output terminal with a second measurement level that is measured when the test signal is output only from the second output terminal, and the display circuit displays a suggestion that the crossover frequency fc0 is changed or maintained, or the control circuit changes or maintains the crossover frequency fc0 to set it.

5. The channel divider according to claim 4, wherein in the test signal output mode, the control circuit compares a third measurement level that is measured when the test signal as the output from the narrow band pass filter BPF is output from both the first output terminal and the second output terminal with the first measurement level and the second measurement level, and when the third measurement level is lower than the first measurement level or the second measurement level by a predetermined value or more, the display circuit displays a suggestion of a change into reverse-phase connection, or the control circuit inverts a phase of the first output signal or the second output signal.

6. The channel divider according to claim 1, further comprising a band-specific sound output mode for outputting only the first output signal from the first output terminal or only the second output signal from the second output terminal in the sound output mode.

7. The channel divider according to claim 1 for dividing the band of the input sound signal into a third output signal whose frequency is lower than that of the first output signal and/or a fourth output signal whose frequency is higher than that of the second output signal, and outputting the third and/or fourth output signals to a third output terminal and/or a fourth output terminal, respectively, wherein the band pass filter BPF is constituted by combining another high-pass filter HPF or another low-pass filter LPF where the low-pass filter LPF and the high-pass filter HPF are connected in series, and output is carried out to the first output terminal or the second output terminal.

8. A sound reproducing system, comprising:

the channel divider according to claim 1;

an amplifier including amplifying circuits corresponding to the output terminals of the channel divider; and a speaker system including at least network circuits corresponding to a woofer and a tweeter, respectively, the speaker system biwiring-connectable to the amplifier.

9. A method for detecting a crossover frequency fc between a woofer and a tweeter set by a network circuit of a speaker system so as to set a crossover frequency fc0 of a channel divider in an audio reproducing system including the channel divider, an amplifier and a speaker system, the channel divider including a low-pass filter LPF and a high-pass filter HPF for dividing a band of an input sound signal into at least a first output signal whose frequency is lower and a second output signal whose frequency is higher than that of the first output signal so as to output them to a first output terminal and a second output terminal respectively, the amplifier including amplifying circuits corresponding to the output terminals of the channel divider respectively, the speaker system including at least a woofer, a tweeter and network circuits corresponding to the woofer and the tweeter respectively, the speaker system biwiring-connectable to the amplifier, the method comprising:

a step of specifying any crossover frequency fc0 for defining the band division of the channel divider;

a step of setting a cutoff frequency fcL of the low-pass filter LPF to a value higher than the crossover frequency fc0 by about ⅙ to 1 Oct.;

a step of setting a cutoff frequency fcH of the high-pass filter HPF to a value lower than the crossover frequency fc0 by about ⅙ to 1 Oct.;

a step of connecting the low-pass filter LPF and the high-pass filter HPF in series so as to compose a narrow band pass filter BPF;

a step of generating a test signal including a predetermined band so as to allow the test signal to pass through the narrow band pass filter BPF; and a step of switching to output the test signal output of the narrow band pass filter BPF only from the first output terminal or only from the second output terminal or from both the first output terminal and the second output terminal.

* * * * *